United States Patent
Liu et al.

(10) Patent No.: US 9,798,200 B2
(45) Date of Patent: Oct. 24, 2017

(54) PIXEL STRUCTURE OF LIQUID CRYSTAL DISPLAY PANEL AND MANUFACTURING METHOD THEREOF

(71) Applicant: Chunghwa Picture Tubes, Ltd., Taoyuan (TW)

(72) Inventors: Yu-Chen Liu, Miaoli County (TW); Ya-Ju Lu, New Taipei (TW); Kuo-Wei Wu, New Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 15/163,692

(22) Filed: May 25, 2016

(65) Prior Publication Data
US 2017/0199438 A1    Jul. 13, 2017

(30) Foreign Application Priority Data
Jan. 7, 2016    (CN) .......................... 2016 1 0007376

(51) Int. Cl.
| | |
|---|---|
| *H01L 29/49* | (2006.01) |
| *G02F 1/1343* | (2006.01) |
| *G02F 1/1333* | (2006.01) |
| *G02F 1/1368* | (2006.01) |
| *H01L 27/12* | (2006.01) |

(52) U.S. Cl.
CPC ...... *G02F 1/134309* (2013.01); *G02F 1/1368* (2013.01); *G02F 1/13439* (2013.01); *G02F 1/133345* (2013.01); *H01L 27/124* (2013.01); *H01L 27/127* (2013.01); *H01L 27/1288* (2013.01); *G02F 2001/134318* (2013.01); *G02F 2001/134372* (2013.01)

(58) Field of Classification Search
CPC ......... G02F 1/134309; G02F 1/133345; G02F 1/13439; G02F 1/1368; H01L 27/124; H01L 27/127; H01L 27/1288
See application file for complete search history.

(56) References Cited

U.S. PATENT DOCUMENTS

| | | | |
|---|---|---|---|
| 8,268,654 B2 | 9/2012 | Fujikawa | |
| 2003/0174269 A1* | 9/2003 | Tanaka | G02F 1/1393 349/129 |
| 2016/0246121 A1* | 8/2016 | Hao | G02F 1/1333 |
| 2016/0291418 A1* | 10/2016 | Du | G02F 1/133345 |
| 2017/0038654 A1* | 2/2017 | Cheng | G02F 1/133345 |

FOREIGN PATENT DOCUMENTS

TW    201516521    5/2015

* cited by examiner

*Primary Examiner* — Michael Shingleton
(74) *Attorney, Agent, or Firm* — Winston Hsu

(57) ABSTRACT

A pixel structure of a liquid crystal display panel includes a substrate, a switch device, a pixel electrode, an insulating layer, and a patterned common electrode. The switch device and the pixel electrode are disposed on the substrate, and the switch device is electrically connected to the pixel electrode. The insulating layer is disposed on the substrate and covers the switch device and the pixel electrode, wherein the insulating layer includes a plurality of trenches. The patterned common electrode is disposed on the insulating layer and does not cover the trenches. The pixel structure of the liquid crystal display panel and related manufacturing method are able to enhance the driving effect of the liquid crystal molecules, reduce the driving voltage and increase alignment performance of the alignment film.

20 Claims, 5 Drawing Sheets

PIXEL STRUCTURE OF LIQUID CRYSTAL DISPLAY PANEL AND MANUFACTURING METHOD THEREOF

BACKGROUND OF THE INVENTION

1. Field of the Invention

The present invention relates to a pixel structure of a liquid crystal display panel and a manufacturing method thereof, and more particularly, to a pixel structure of a liquid crystal display panel and a manufacturing method thereof with the performance that the liquid crystal molecules can be effectively driven.

2. Description of the Prior Art

Generally, in the pixel structure of a fringe field switching (FFS) liquid crystal display panel, an insulating layer is disposed between a common electrode and a pixel electrode, and an alignment layer is disposed above the insulating layer, the common electrode and the pixel electrode. When a voltage is applied to drive the liquid crystal molecules, the liquid crystal molecules may not be effectively tilted due to the thickness of the insulating layer. Accordingly, the response speed of liquid crystal molecules is slow. Although increasing the voltage may drive the liquid crystal molecules more effectively, it will increase the operation cost. In addition, the rubbing on the alignment layer is likely to influence the electric property of the liquid crystal display panel, which causes static electrical damage problems, such that the alignment effect of the liquid crystal molecules is reduced. In view of the above mentioned problems, it becomes an aim in the industry to provide a pixel structure that is able to enhance the driving effect of the liquid crystal molecules, so as to reduce the driving voltage and to improve alignment effect at the same time.

SUMMARY OF THE INVENTION

One of the objectives of the present invention is to provide a pixel structure of a liquid crystal display panel and a manufacturing method thereof so as to enhance the driving effect of the liquid crystal molecules, reduce the driving voltage and improve the alignment effect.

To achieve the above objectives, the present invention provides a pixel structure of a liquid crystal display panel which includes:

a substrate;
a switch device and a pixel electrode disposed on the substrate, the switch device being electrically connected to the pixel electrode;
an insulating layer disposed on the substrate and covering the switch device and the pixel electrode, wherein the insulating layer includes a plurality of trenches; and
a patterned common electrode disposed on the insulating layer, wherein the patterned common electrode does not cover the plurality of trenches.

Preferably, the switch device includes:
a gate electrode;
a gate insulating layer disposed on the gate electrode;
a semiconductor layer disposed on the gate insulating layer and partially overlapping the gate electrode;
a source electrode and a drain electrode disposed on the gate insulating layer and partially covering the semiconductor layer respectively;
a source contact layer disposed between the semiconductor layer and the source electrode, the source electrode at least partially covering the source contact layer; and
a drain contact layer disposed between the semiconductor layer and the drain electrode, the drain electrode at least partially covering the drain contact layer, wherein the switch device is electrically connected to the pixel electrode via the drain electrode, and the semiconductor layer and the pixel electrode are disposed at a same plane.

Preferably, the gate insulating layer is disposed between the pixel electrode and the substrate.

Preferably, the depths of the plurality of trenches are in a range from about 500 angstroms to about 2000 angstroms.

Preferably, the patterned common electrode has a plurality of slits and each of the slits is disposed corresponding to one of the trenches.

Preferably, the width of each of the slits is substantially equal to the width of the corresponding trench.

Preferably, the trenches do not have identical widths with each other.

Preferably, the trenches include a plurality of first trenches and a second trench, the plurality of first trenches are disposed above the pixel electrode and partially overlap the pixel electrode, and the second trench is disposed above the switch device and partially overlaps the switch device.

Preferably, the widths of the plurality of first trenches are smaller than the width of the second trench.

Preferably, the patterned common electrode includes a plurality of branch electrodes and the plurality of branch electrodes are respectively disposed between two of the plurality of trenches adjacent to each other.

Preferably, the material of the insulating layer includes an inorganic insulating material.

The present invention further provides a method of manufacturing a pixel structure of a liquid crystal display panel, which includes:

providing a substrate;
forming a switch device and a pixel electrode on the substrate, wherein the switch device is electrically connected to the pixel electrode;
forming an insulating layer on the substrate, wherein the insulating layer covers the switch device and the pixel electrode;
forming a common electrode layer on the insulating layer;
forming a patterned photoresist layer on the common electrode layer, wherein the patterned photoresist layer includes a plurality of discontinuous patterns;
performing a first etching process to remove a portion of the common electrode layer by taking the patterned photoresist layer as an etching mask so as to form a patterned common electrode;
performing a second etching process to remove part of a surface of the insulating layer by taking the patterned photoresist layer as an etching mask so as to form a plurality of trenches in the insulating layer, wherein the patterned common electrode does not cover the plurality of trenches; and
removing the patterned photoresist layer.

Preferably, the first etching process further includes forming a plurality of slits in the common electrode layer to form the patterned common electrode, and each of the slits is disposed corresponding to one of the trenches.

Preferably, the width of each of the slits is substantially equal to the width of the corresponding trench.

Preferably, the trenches do not have identical widths with each other.

Preferably, the first etching process includes a wet etching process.

Preferably, the second etching process includes a dry etching process.

Preferably, the depths of the plurality of trenches are in a range from about 500 angstroms to about 2000 angstroms.

Preferably, the material of the insulating layer includes an inorganic insulating material.

Preferably, the step of forming the switch device includes:
forming a gate electrode on the substrate;
forming a gate insulating layer on the substrate to cover the gate electrode;
sequentially forming a semiconductor layer and a contact layer on the gate insulating layer;
patterning the semiconductor layer and the contact layer, so that the semiconductor layer is patterned to forma semiconductor channel layer;
forming a source electrode and a drain electrode on the contact layer, wherein the source electrode and the drain electrode partially cover the contact layer and the semiconductor layer respectively; and
removing a portion of the contact layer disposed between the source electrode and the drain electrode to form a source contact layer and a drain contact layer, wherein the source contact layer is disposed between the semiconductor layer and the source electrode, the source electrode partially covers the source contact layer, the drain contact layer is disposed between the semiconductor layer and the drain electrode, the drain electrode partially covers the drain contact layer, the switch device is electrically connected to the pixel electrode via the drain electrode, and the semiconductor layer and the pixel electrode are disposed at a same plane.

Preferably, the gate insulating layer is disposed between the pixel electrode and the substrate.

The insulating layer of the pixel structure of the liquid crystal display panel according to the present invention has trenches, so that the liquid crystal molecules are able to be disposed in the trenches of the insulating layer. Accordingly, the distance between the pixel electrode and the liquid crystal molecules is reduced, which makes it easier to drive the liquid crystal molecules, thereby enhancing the response speed of the liquid crystal molecules and reducing the driving voltage. In addition, the trenches of the insulating layer provide the function of assisting alignment of the liquid crystal molecules, such that the alignment effect of the liquid crystal molecules is enhanced.

DETAILED DESCRIPTION

The present invention discloses a pixel structure of a liquid crystal display panel. The pixel structure of the following embodiment is applied to a fringe field switching (FFS) liquid crystal display panel as an example. However, the pixel structure of the present invention of the present invention is not limited to being applied to FFS liquid crystal display panel, and may also be applied to other suitable kinds of liquid crystal display panels. Please refer to FIG. 1 to FIG. 8. The method of manufacturing the pixel structure P of the liquid crystal display panel of the present invention is described below.

Figure 1:
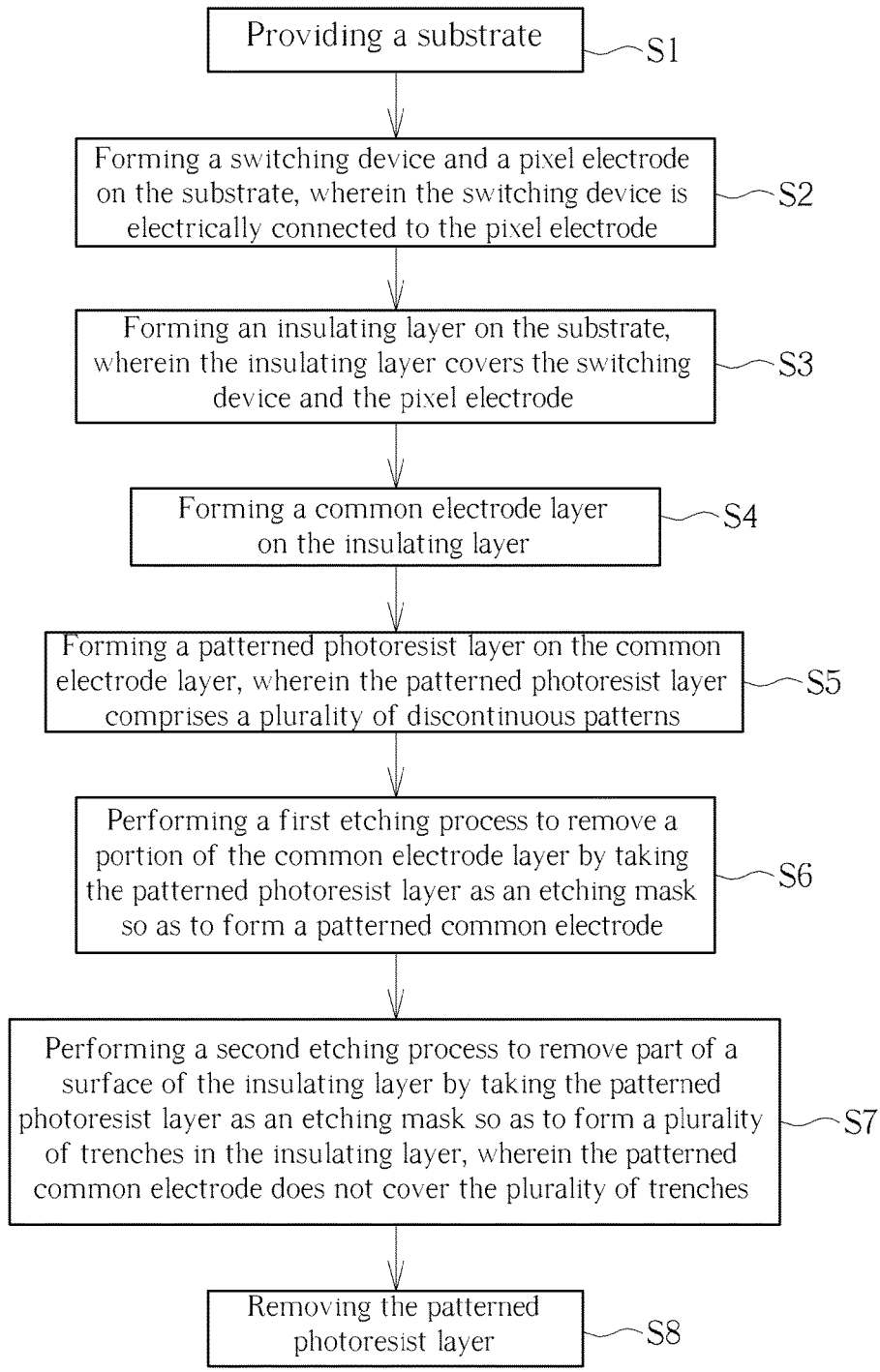
FIG. 1 is a flowchart of a method of manufacturing a pixel structure of a liquid crystal display panel of the present invention.
Figure 2:
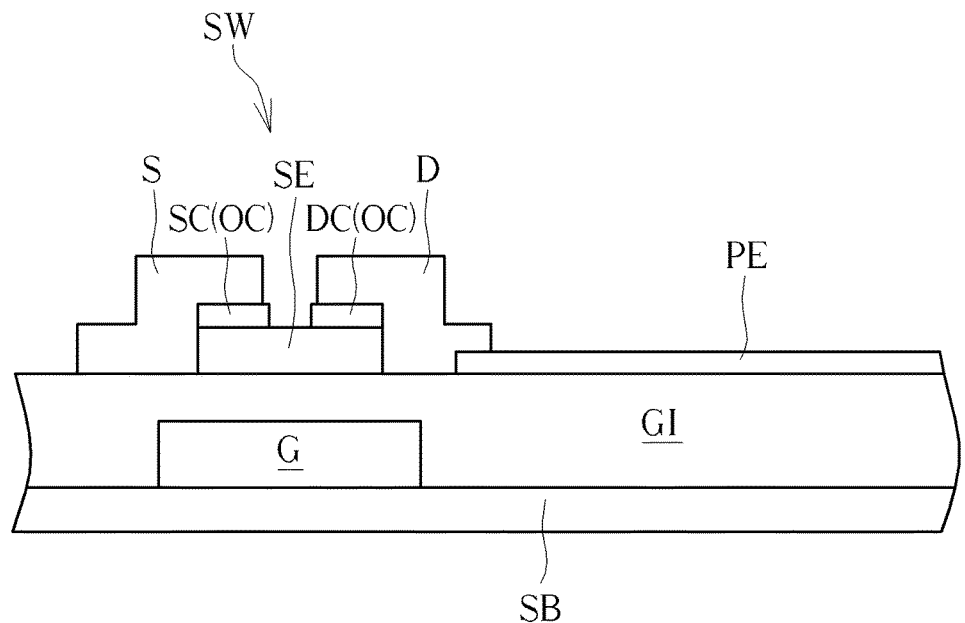
FIG. 2 is a schematic diagram of forming a switch device and a pixel electrode on a substrate according to the method of manufacturing the pixel structure of the liquid crystal display panel of the present invention.

First, as shown in FIG. 2, the step S1 in FIG. 1 is performed to provide a substrate SB, wherein the substrate SB may include a transparent substrate, for example, a glass substrate, a plastic substrate, or a quartz substrate, but not limited thereto. The substrate SB may be any kind of rigid substrates or flexible substrates. Next, the step S2 is performed to forma switch device SW and a pixel electrode PE on the substrate SB, wherein the switch device SW is electrically connected to the pixel electrode PE. The pixel electrode PE of the present embodiment may be a planar electrode and its entire surface is flat, i.e., the display area of the pixel electrode PE does not include slits or branch electrodes, but not limited thereto. In a variant embodiment, the pixel electrode PE may also have slits or branch electrodes. The method of forming the switch device SW of the present embodiment may include the following steps. First, a gate electrode G is formed on the substrate SB. Then, a gate insulating layer GI is formed on the substrate SB to cover the gate electrode G. A semiconductor layer SE and a contact layer OC are sequentially formed on the gate insulating layer GI, followed by patterning the semiconductor layer SE and the contact layer OC, so that the semiconductor layer SE is patterned to form a semiconductor channel layer. After that, a source electrode S and a drain electrode D are formed on the contact layer OC, wherein the source electrode S and the drain electrode D partially cover the contact layer OC and the semiconductor layer SE respectively. Finally, a portion of the contact layer OC disposed between the source electrode S and the drain electrode D are removed to form a source contact layer SC and a drain contact layer DC.

Accordingly, the switch device SW of the present embodiment includes the gate electrode G, the gate insulating layer GI, the semiconductor layer SE, the source electrode S, the drain electrode D, the source contact layer SC and the drain contact layer DC. The gate insulating layer GI is disposed on the gate electrode G. The semiconductor layer SE is disposed on the gate insulating layer GI and partially overlaps the gate electrode G. The source electrode S and the drain electrode D are disposed on the gate insulating layer GI and partially cover the semiconductor layer SE respectively. The source contact layer SC is disposed between the semiconductor layer SE and the source electrode S, and the source electrode S partially covers the source contact layer SC. The drain contact layer DC is disposed between the semiconductor layer SE and the drain electrode D, and the drain electrode D partially covers the drain contact layer DC. In the present embodiment, the switch device SW is a bottom gate type thin film transistor, but the present invention is not limited thereto. The switch device SW may also be a top gate type thin film transistor or other suitable types of thin film transistors. In addition, the switch device SW is electrically connected to the pixel electrode PE via the drain electrode D, the semiconductor layer SE and the pixel electrode PE are disposed at a same plane, and the gate insulating layer GI is disposed between the pixel electrode PE and the substrate SB. Thus, the pixel electrode PE may be formed after the gate insulating layer GI is formed. For example, a transparent conductive layer may be blanketly formed on the gate insulating layer GI, and then the transparent conductive layer is patterned to form the pixel electrode PE. Therefore, the following fabricated source electrode S and drain electrode D are formed above the pixel electrode PE, thereby the drain electrode D partially covering the pixel electrode PE to electrically connect with the pixel electrode PE. However, in other embodiments, the pixel electrode PE may be formed after the formation of the switch device SW, and therefore the pixel electrode PE covers the drain electrode D and to electrically connect with the drain electrode D. In such circumstance, the drain electrode D is disposed between the pixel electrode PE and the gate electrode G, and the pixel electrode PE and the semiconductor layer SE are disposed at a same plane.

Figure 3:
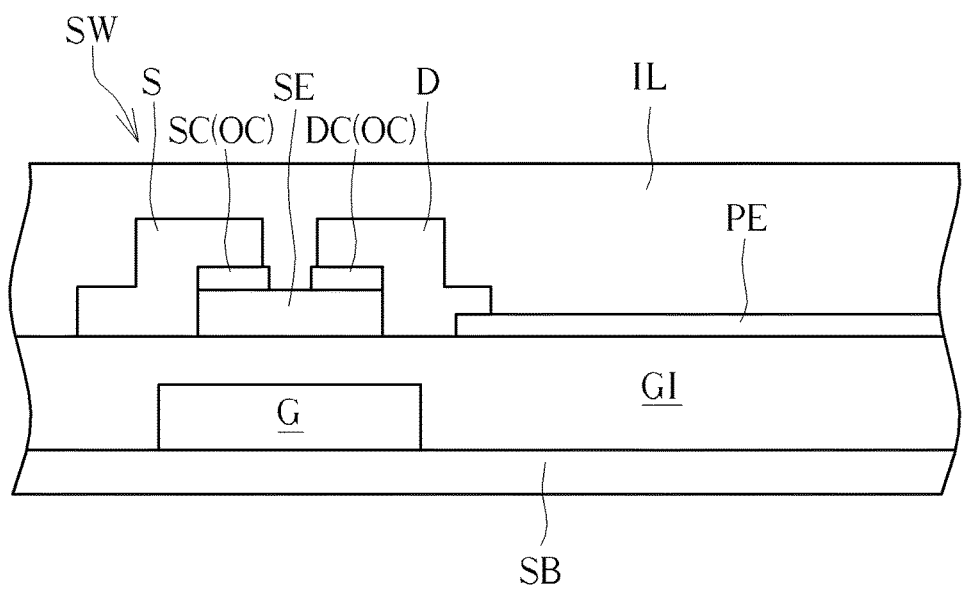
FIG. 3 is a schematic diagram of forming an insulating layer on the substrate according to the method of manufacturing the pixel structure of the liquid crystal display panel of the present invention.
Figure 4:
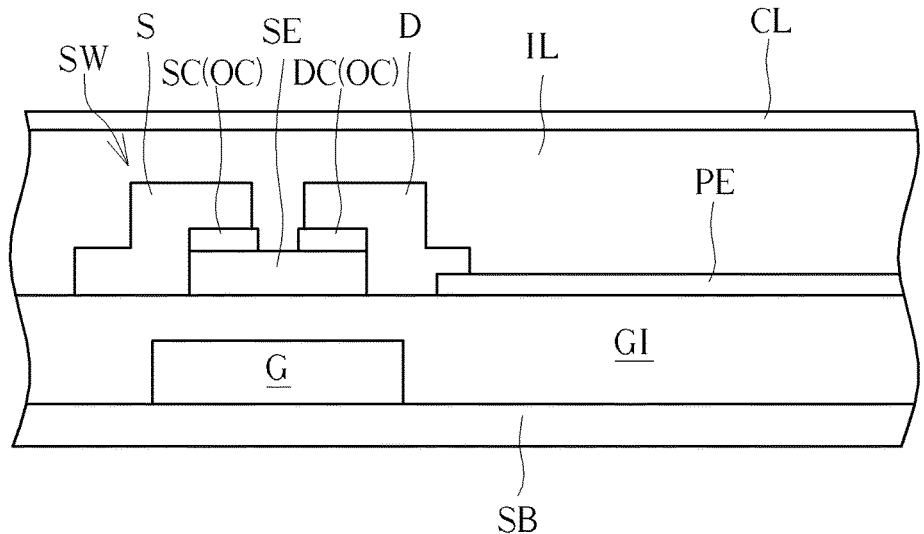
FIG. 4 is a schematic diagram of forming a common electrode layer on the insulating layer according to the method of manufacturing the pixel structure of the liquid crystal display panel of the present invention.

Next, as shown in FIG. 1 and FIG. 3, the step S3 is performed to form an insulating layer IL on the substrate SB. The insulating layer IL covers the switch device SW and the pixel electrode PE, wherein the material of the insulating layer IL includes an inorganic insulating material, e.g., silicon nitride, silicon oxide, silicon oxynitride, or combinations thereof. Then, as shown in FIG. 1 and FIG. 4, the step S4 is performed to form a common electrode layer CL on the insulating layer IL, wherein the common electrode layer CL entirely covers the surface of the insulating layer IL. The material of the common electrode layer CL may include various types of transparent conductive materials, e.g., indium tin oxide (ITO), indium zinc oxide (IZO), aluminum zinc oxide (AZO), indium oxide (InO), or other suitable transparent conductive materials, or a combination thereof.

Figure 5:
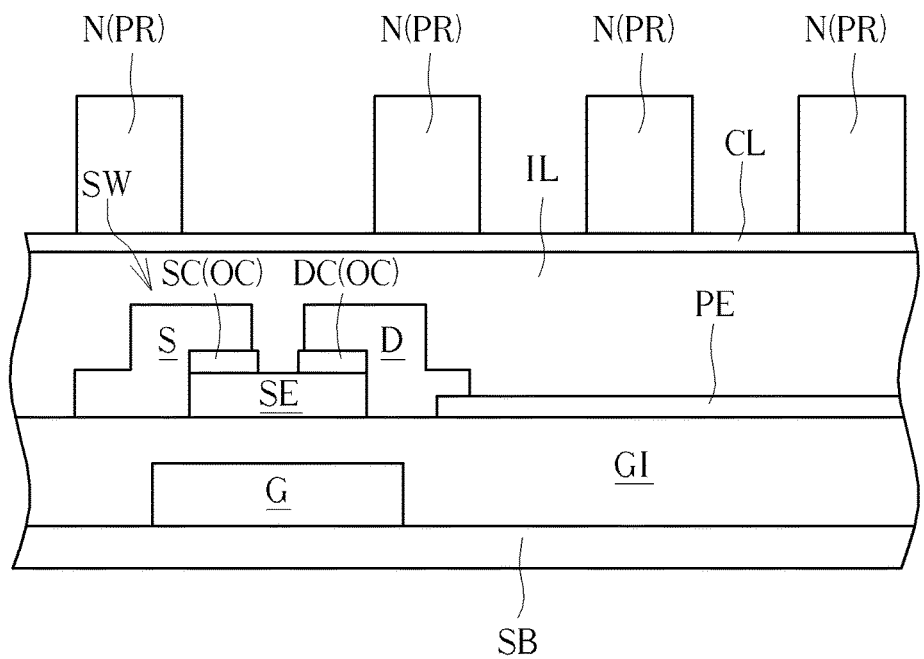
FIG. 5 is a schematic diagram of forming a patterned photoresist on the common electrode layer according to the method of manufacturing the pixel structure of the liquid crystal display panel of the present invention.
Figure 6:
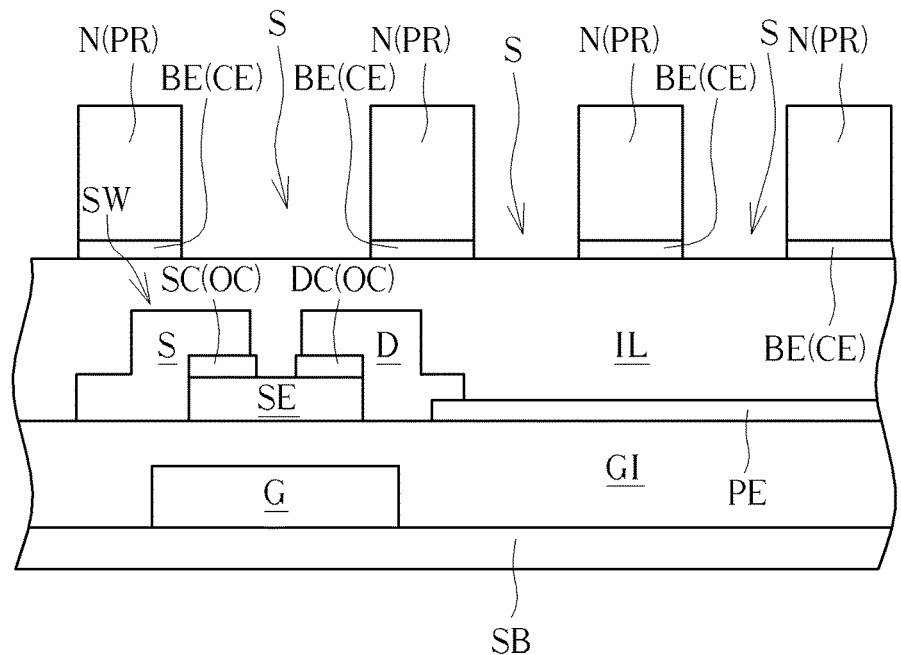
FIG. 6 is a schematic diagram of performing a first etching process according to the method of manufacturing the pixel structure of the liquid crystal display panel of the present invention.

Thereafter, as shown in FIG. 1 and FIG. 5, the step S5 is performed to form a patterned photoresist layer PR on the common electrode layer CL, wherein the patterned photoresist layer PR includes a plurality of discontinuous patterns N. Precisely, the discontinuous patterns N of the patterned photoresist layer PR expose part of the common electrode layer CL. Subsequently, as shown in FIG. 1 and FIG. 6, the step S6 is performed to conduct a first etching process to remove a portion of the common electrode layer CL by taking the patterned photoresist layer PR as an etching mask so as to form a patterned common electrode CE. Specifically, the first etching process may include a wet etching process, and the first etching process further includes forming a plurality of slits SL in the common electrode layer CL, i.e., the patterned common electrode CE includes a plurality of slits SL. Therefore, the patterned common electrode CE may be regarded as having a plurality of branch electrodes BE, wherein each of the slits SL is disposed between two adjacent branch electrodes BE.

Figure 7:
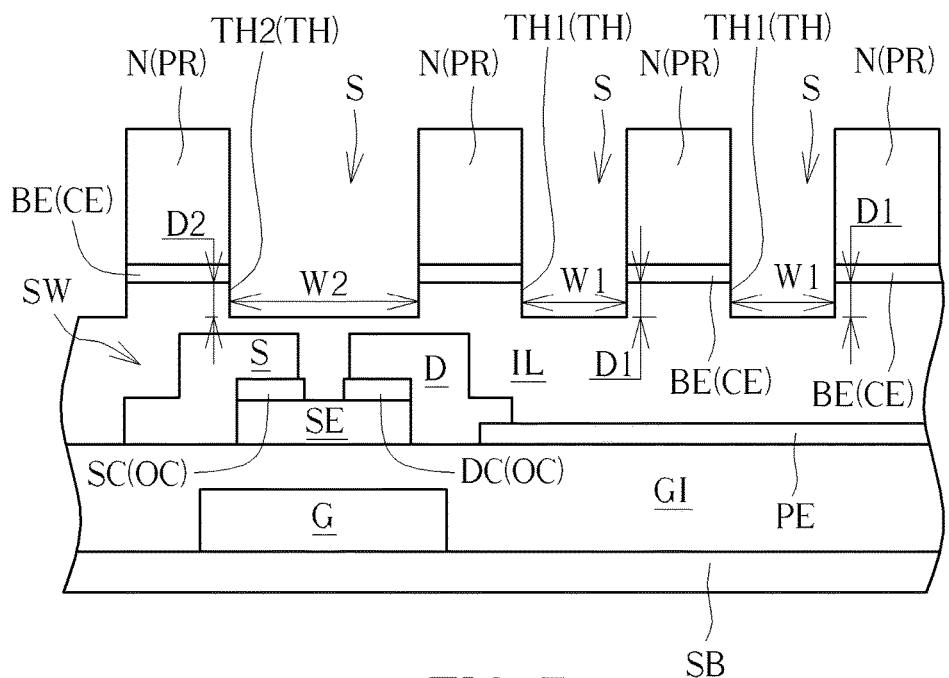
FIG. 7 is a schematic diagram of performing a second etching process according to the method of manufacturing the pixel structure of the liquid crystal display panel of the present invention.

Then, as shown in FIG. 1 and FIG. 7, the step S7 is performed to conduct a second etching process to remove part of the surface of the insulating layer IL by taking the patterned photoresist layer PR as the etching mask so as to form a plurality of trenches TH in the insulating layer IL, wherein the patterned common electrode CE does not cover the trenches TH. The second etching process of the present embodiment may include, for example, a dry etching process. Specifically, since both the first etching process and the second etching process of the present invention take the same patterned photoresist layer PR as the etching mask, each of the trenches TH of the insulating layer IL is disposed corresponding to one of the slits SL of the patterned common electrode CE, and the widths of each of the trenches TH is substantially equal to the width of the corresponding slit SL. Therefore, the branch electrodes BE are respectively disposed between two adjacent trenches TH. According to the present invention, the trenches TH may not have identical widths with each other. For example, the trenches TH may further include a plurality of first trenches TH1 and one second trench TH2. The first trenches TH1 are disposed above the pixel electrode PE and partially overlap the pixel electrode PE, and the second trench TH2 is disposed above the switch device SW and partially overlaps the switch device SW, wherein the widths of the first trenches TH1 are preferably smaller than the width of the second trench TH2, but the present invention is not limited thereto. The widths of the trenches TH may be adjust according to the widths of the slits SL of the patterned common electrode CE. In addition, the depths of the trenches TH formed by the second etching process are preferably in a range from about 500 angstroms to about 2000 angstroms, and the depths D1 of the first trenches TH1 is substantially equal to the depth D2 of the second trench TH2, but the present invention is not limited thereto.

Figure 8:
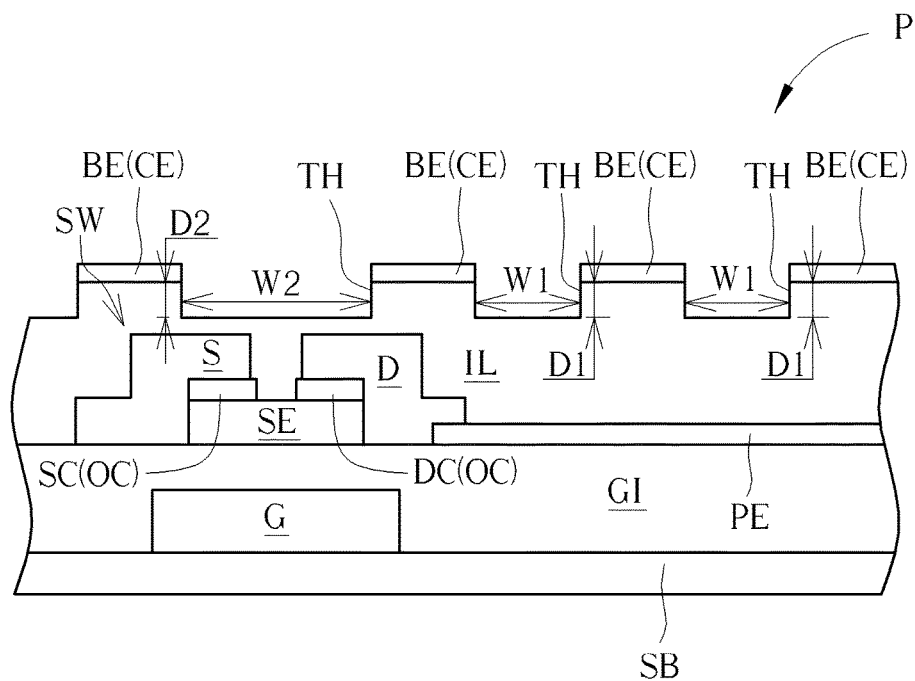
FIG. 8 is a cross-sectional view of the pixel structure of the liquid crystal display panel of the present invention.

Finally, please refer to FIG. 8. The step S8 illustrated in FIG. 1 is performed to remove the patterned photoresist layer PR to complete the manufacture of the pixel structure P of the liquid crystal display panel according to the present invention. As shown in FIG. 8, the pixel structure P of the liquid crystal display panel according to the present invention includes the substrate SB, the switch device SW, the pixel electrode PE, the insulating layer IL, and the patterned common electrode CE. The switch device SW and the pixel electrode PE are disposed on the substrate SB, and the switch device SW is electrically connected to the pixel electrode PE. The insulating layer IL is disposed on the substrate SB and covers the switch device SW and the pixel electrode PE, wherein the insulating layer IL includes a plurality of trenches TH. In addition, the patterned common electrode CE is disposed on the insulating layer IL, wherein the patterned common electrode CE does not cover the plurality of trenches TH.

In another aspect, referring to FIG. 1 again, the method of manufacturing the pixel structure P of the liquid crystal display panel according to the present invention may be summarized as follows, which includes the following steps:

Step S1: Providing substrate SB;

Step S2: Forming a switch device SW and a pixel electrode PE on the substrate SB, wherein the switch device SW is electrically connected to the pixel electrode PE;

Step S3: Forming an insulating layer IL on the substrate SB, wherein the insulating layer IL covers the switch device SW and the pixel electrode PE;

Step S4: Forming a common electrode layer CL on the insulating layer IL;

Step S5: Forming a patterned photoresist layer PR on the common electrode layer CL, wherein the patterned photoresist layer PR includes a plurality of discontinuous patterns N;

Step S6: Performing a first etching process to remove a portion of the common electrode layer CL by taking the patterned photoresist layer PR as an etching mask so as to form a patterned common electrode CE;

Step S7: Performing a second etching process to remove part of the surface of the insulating layer IL by taking the patterned photoresist layer PR as an etching mask so as to form a plurality of trenches TH in the insulating layer IL, wherein the patterned common electrode CE does not cover the plurality of trenches TH; and Step S8: Removing the patterned photoresist layer PR.

Figure 9:
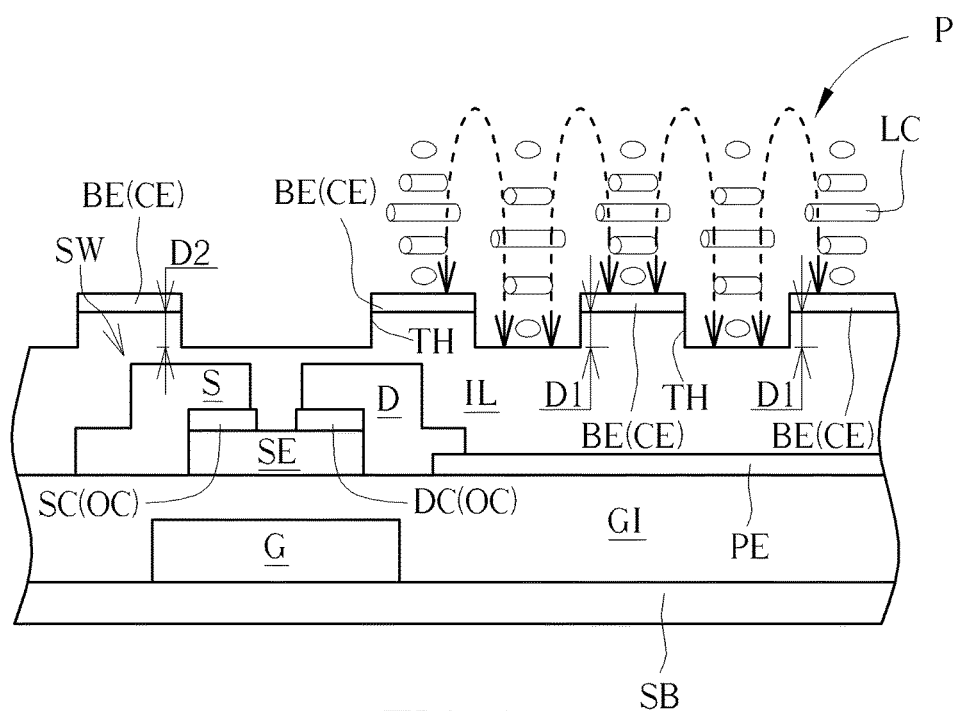
FIG. 9 is a schematic diagram illustrating the operation electric field of the pixel structure of the liquid crystal display panel of the present invention.

An explanation of applying the pixel structure P of the present invention to a fringe field switching liquid crystal display panel will be provided hereinafter as an example, but those skilled in the art should be aware that the pixel structure P of the present invention may be applied to all kinds of suitable display panels. Please refer to FIG. 9, which is a schematic diagram of the operation electric field of the pixel structure of the liquid crystal display panel according to the present invention, wherein the dotted line in the FIG. 9 represents the direction of the electric field. Specifically, when the pixel structure P of the present invention is applied to a fringe field switching liquid crystal display panel, some of the liquid crystal molecules LC may be present in the trenches TH since the insulating layer IL of the present invention has a plurality of trenches TH. Accordingly, the liquid crystal molecules LC in the trenches TH are closer to the pixel electrode PE. In other words, the distance between the liquid crystal molecules LC and the pixel electrode PE is reduced. As a result, when a voltage is applied for driving the liquid crystal molecules LC, the liquid crystal molecules LC are easier to be driven without changing the capacity between the pixel electrode PE and the patterned common electrode CE. As such, the response speed of the liquid crystal molecules LC is improved. Moreover, since the liquid crystal molecules LC are easier to be driven, only a low operating voltage is required to effective rotate the liquid crystal molecules LC, thus the driving voltage of the liquid crystal molecules LC can be reduced. Furthermore, the trenches TH of the insulating layer IL may assist the alignment effect of the liquid crystal molecules LC, so that the alignment effect of the liquid crystal molecules LC is enhanced. In addition, since the trenches TH of the insulating layer IL of the present invention are formed by the second etching process by taking the same patterned photoresist layer PR as the etching mask, the present invention is able to manufacture the structure of the insulating layer IL having the trenches TH without increasing the cost of the etching mask.

In summary, the insulating layer of the pixel structure of the liquid crystal display panel according to the present invention has trenches, so that the liquid crystal molecules are able to be disposed in the trenches of the insulating layer. Accordingly, the distance between the pixel electrode and the liquid crystal molecules is reduced, making it easier to drive the liquid crystal molecules and thereby enhancing the response speed of the liquid crystal molecules, so as to reduce the driving voltage and the operation cost. In addition, the trenches of the insulating layer have alignment ability, such that the alignment performance of the liquid crystal molecules is enhanced.

What is claimed is:

1. A pixel structure of a liquid crystal display panel, comprising:
    a substrate;
    a switch device and a pixel electrode disposed on the substrate, the switch device being electrically connected to the pixel electrode;
    an insulating layer disposed on the substrate and covering the switch device and the pixel electrode, wherein the insulating layer comprises a plurality of trenches; and
    a patterned common electrode disposed on the insulating layer, wherein the patterned common electrode does not cover the plurality of trenches.

2. The pixel structure of the liquid crystal display panel according to claim 1, wherein the switch device comprises:
    a gate electrode;
    a gate insulating layer disposed on the gate electrode;
    a semiconductor layer disposed on the gate insulating layer and partially overlapping the gate electrode;
    a source electrode and a drain electrode disposed on the gate insulating layer and partially covering the semiconductor layer respectively;
    a source contact layer disposed between the semiconductor layer and the source electrode, the source electrode at least partially covering the source contact layer; and
    a drain contact layer disposed between the semiconductor layer and the drain electrode, the drain electrode at least partially covering the drain contact layer, wherein the switch device is electrically connected to the pixel electrode via the drain electrode, and the semiconductor layer and the pixel electrode are disposed at a same plane.

3. The pixel structure of the liquid crystal display panel according to claim 2, wherein the gate insulating layer is disposed between the pixel electrode and the substrate.

4. The pixel structure of the liquid crystal display panel according to claim 1, wherein depths of the plurality of trenches are in a range from about 500 angstroms to about 2000 angstroms.

5. The pixel structure of the liquid crystal display panel according to claim 1, wherein the patterned common electrode has a plurality of slits and each of the slits is disposed corresponding to one of the trenches.

6. The pixel structure of the liquid crystal display panel according to claim 5, wherein a width of each of the slits is substantially equal to a width of the corresponding trench.

7. The pixel structure of the liquid crystal display panel according to claim 1, wherein the trenches do not have identical widths with each other.

8. The pixel structure of the liquid crystal display panel according to claim 1, wherein the trenches comprise a plurality of first trenches and a second trench, the plurality of first trenches are disposed above the pixel electrode and partially overlap the pixel electrode, and the second trench is disposed above the switch device and partially overlaps the switch device.

9. The pixel structure of the liquid crystal display panel according to claim 8, wherein widths of the plurality of first trenches are smaller than a width of the second trench.

10. The pixel structure of the liquid crystal display panel according to claim 8, wherein the patterned common electrode comprises a plurality of branch electrodes and the plurality of branch electrodes are respectively disposed between two of the plurality of trenches adjacent to each other.

11. The pixel structure of the liquid crystal display panel according to claim 1, wherein a material of the insulating layer comprises an inorganic insulating material.

12. A method of manufacturing a pixel structure of a liquid crystal display panel, comprising following steps:
providing a substrate;
forming a switch device and a pixel electrode on the substrate, wherein the switch device is electrically connected to the pixel electrode;
forming an insulating layer on the substrate, wherein the insulating layer covers the switch device and the pixel electrode;
forming a common electrode layer on the insulating layer;
forming a patterned photoresist layer on the common electrode layer, wherein the patterned photoresist layer comprises a plurality of discontinuous patterns;
performing a first etching process to remove a portion of the common electrode layer by taking the patterned photoresist layer as an etching mask so as to form a patterned common electrode;
performing a second etching process to remove part of a surface of the insulating layer by taking the patterned photoresist layer as an etching mask so as to form a plurality of trenches in the insulating layer, wherein the patterned common electrode does not cover the plurality of trenches; and
removing the patterned photoresist layer.

13. The method of claim 12, wherein the first etching process further comprises forming a plurality of slits in the common electrode layer to form the patterned common electrode and each of the slits is disposed corresponding to one of the trenches.

14. The method of claim 13, wherein a width of each of the slits is substantially equal to a width of the corresponding trench.

15. The method of claim 12, wherein the trenches do not have identical widths with each other.

16. The method of claim 12, wherein the first etching process comprises a wet etching process.

17. The method of claim 12, wherein the second etching process comprises a dry etching process.

18. The method of claim 12, wherein depths of the plurality of trenches are in a range from about 500 angstroms to about 2000 angstroms.

19. The method of claim 12, wherein a material of the insulating layer comprises an inorganic insulating material.

20. The method of claim 12, wherein the step of forming the switch device comprises:
forming a gate electrode on the substrate;
forming a gate insulating layer on the substrate to cover the gate electrode;
sequentially forming a semiconductor layer and a contact layer on the gate insulating layer;
patterning the semiconductor layer and the contact layer, so that the semiconductor layer is patterned to form a semiconductor channel layer;
forming a source electrode and a drain electrode on the contact layer, wherein the source electrode and the drain electrode partially cover the contact layer and the semiconductor layer respectively; and
removing a portion of the contact layer disposed between the source electrode and the drain electrode to form a source contact layer and a drain contact layer, wherein the source contact layer is disposed between the semiconductor layer and the source electrode, the source electrode partially covers the source contact layer, the drain contact layer is disposed between the semiconductor layer and the drain electrode, the drain electrode partially covers the drain contact layer, the switch device is electrically connected to the pixel electrode via the drain electrode, and the semiconductor layer and the pixel electrode are disposed at a same plane.

\* \* \* \* \*